(12) United States Patent
Savage et al.

(10) Patent No.: US 11,862,117 B2
(45) Date of Patent: Jan. 2, 2024

(54) METHOD AND APPARATUS FOR MATCHED BUFFER DECOMPRESSION

(71) Applicant: Texas Instruments Incorporated, Dallas, TX (US)

(72) Inventors: Stephen Phillip Savage, Richardson, TX (US); Harsh Dinesh Jhaveri, Wylie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/388,943

(22) Filed: Jul. 29, 2021

(65) Prior Publication Data

US 2022/0165223 A1 May 26, 2022

Related U.S. Application Data

(60) Provisional application No. 63/118,040, filed on Nov. 25, 2020.

(51) Int. Cl.
*G09G 5/395* (2006.01)
*G09G 3/34* (2006.01)
*H03M 7/30* (2006.01)
*G09G 5/399* (2006.01)

(52) U.S. Cl.
CPC .......... *G09G 3/346* (2013.01); *G09G 5/395* (2013.01); *G09G 5/399* (2013.01); *H03M 7/30* (2013.01); *G09G 2310/08* (2013.01); *G09G 2340/02* (2013.01); *G09G 2370/00* (2013.01)

(58) Field of Classification Search
CPC ........ G09G 3/346; G09G 5/395; G09G 5/399; G09G 2310/08; G09G 2340/02; G09G 2370/00
See application file for complete search history.

(56) References Cited

U.S. PATENT DOCUMENTS

| | | | | |
|---|---|---|---|---|
| 2002/0144029 A1* | 10/2002 | Duggan | ................. | G06F 13/385 710/36 |
| 2013/0094615 A1* | 4/2013 | Dimitriu | ................... | H04L 7/04 375/362 |
| 2013/0138918 A1* | 5/2013 | Muff | .................... | G06F 15/7825 712/E9.028 |
| 2014/0210872 A1* | 7/2014 | Sasaki | .................. | G09G 3/3648 345/690 |
| 2016/0125843 A1* | 5/2016 | Kim | ....................... | G09G 5/028 345/600 |
| 2018/0010903 A1* | 1/2018 | Takao | .................... | G01S 7/4816 |
| 2018/0156867 A1* | 6/2018 | Rajski | ............ | G01R 31/318563 |

* cited by examiner

*Primary Examiner* — Hau H Nguyen
(74) *Attorney, Agent, or Firm* — Michelle F. Murray; Frank D. Cimino (57) ABSTRACT

Method and apparatus for matched buffer decompression. In some examples, a circuit comprising a first data element, a second data element, a first buffer coupled to the first data element, a second buffer coupled to the second data element, compression override logic circuits coupled to the first data element and the second data element, and a parallel register coupled to the compression override logic circuits.

20 Claims, 7 Drawing Sheets

METHOD AND APPARATUS FOR MATCHED BUFFER DECOMPRESSION

RELATED APPLICATIONS

This patent claims the benefit of U.S. Provisional Patent Application Ser. No. 63/118,040, which was filed on Nov. 25, 2020. U.S. Provisional Patent Application No. 63/118,040 is hereby incorporated herein by reference in its entirety. Priority to U.S. Provisional Patent Application No. 63/118,040 is hereby claimed.

DETAILED DESCRIPTION

Decompression circuits may be utilized to transfer data on devices. Such data may be video data, image data, audio data, text data, numerical data, etc. In some examples, data decompression circuits are used to transfer data on a display device. The data may be transferred from a display device transceiver side including a transceiver device to a display device receiver side including a parallel register. The transceiver device may capture and prepare the data to be transferred to the parallel register. The parallel register may store data to be utilized by a memory operator to perform memory operations for transferring the data from the parallel register to a memory.

Data may include groups of similar data such as, for example, similar data regions, rows, columns, etc. In one example, the data is image data including similar adjacent rows, such as dark sections. The transceiver device may exploit these data similarities by implementing compression algorithms (e.g., lossless compression algorithms) to decrease the time and energy needed to transmit the data from the transceiver side to the receiver side of the display device.

In some examples, pipelining is utilized to transfer data from the transceiver side to the receiver side of the display device. The pipelining may be synchronous and include multiple pipeline stages. In cases where the pipelining is synchronous, the pipeline stages receive the same timing by being on the same clock (e.g., the pipeline stages receive the same clock signal). The pipeline stages may include synchronous logic utilizing a register-based implementation. In one example, each pipeline stage is a shift register, which inserts a clock cycle. These shift registers may be synchronous registers, causing a synchronous delay (e.g., stalls) between each shift register. The shift registers may move data and accept data every clock cycle. However, in some cases, the input data and the output data may not be ready every clock cycle, which can lead to additional stalls. The pipeline stalls may require complex compression hardware for the transceiver device, which increases the risk of bugs to stop performance of the lossless compression algorithms.

Example approaches disclosed herein implement a decompression circuit including buffers to transfer data (e.g., compressed data) on a display device such as, for example, from a transceiver side to a receiver side of the display device. The buffers load the data to data elements. As used herein, a data element refers a portion of a bus including data transferred in a single internal clock cycle. In one example, the data element is a 64-bit data element. The buffers are controlled by clock signals including clock events. The clock events cause the buffers to load data to the data elements. The buffers are matched utilizing matching techniques. The buffers may be matched in quantity (e.g., determining a number of buffers on the display device) and layout (e.g., determining locations and routing of buffers on the display device) to affect the timing of data arriving at buffers. Further, the clock signals are matched to prevent delays loading data to the data elements. The buffers and clock signals are matched to maintain relationships between the timing of data and clock events arriving at buffers, such as a timing margin. The timing margin is the required time difference between data and a clock event arriving at the buffer for the decompression circuit to function correctly (e.g., the correct data loading to the data element). For example, data arrives at a buffer at a first time, and a clock event to a data element arrives at a second time. The time difference between the first time and the second time is to be matched based on the timing margin. In one example, the data elements are loaded with the compressed data including data bits for a data row and/or a data column. The data elements may be loaded at different times, so long as all data bits are loaded to the data elements before a parallel shift clock event included in a parallel shift clock signal. The parallel shift clock event causes data from the data elements to be decompressed and transferred to the parallel register. As a result, asynchronous delay across loading the data elements is removed and the data is loaded to the parallel register in a single internal clock cycle (e.g., a clock cycle of the parallel shift clock signal).

Figure 1:
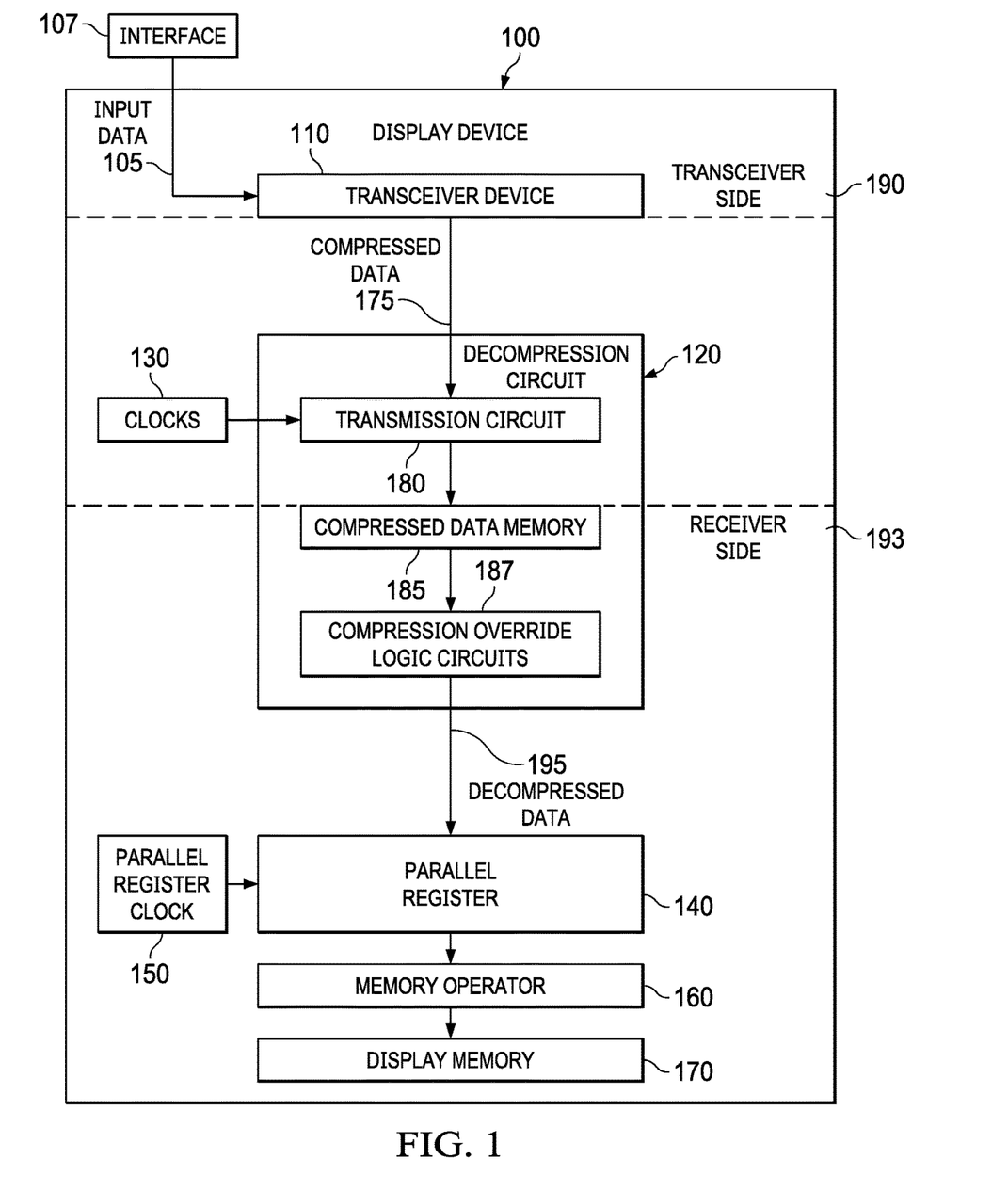
FIG. 1 is a block diagram of an example display device.

FIG. 1 is a block diagram of an example display device 100. The display device 100 may be utilized in any display system such as, for example, a projector system, a video wall, a multi-view monitor, a stereoscopic display, a monitor with multiple display surfaces, a multi-focal plane display, a near eye display (e.g., 3D glasses), a headset, a vehicle headlight, etc. The display device 100 may be any display device such as, for example, a digital micromirror device (DMD), a liquid crystal display, a magneto-optic spatial light modulator, a liquid crystal on silicon (LcOS) display, a microLED display, a phase light modulator (PLM), etc. In the example of FIG. 1, the display device 100 includes a transceiver device 110, a decompression circuit 120, clocks 130, a parallel register 140, a parallel register clock 150, a memory operator 160, and a display memory 170.

The display device 100 may obtain input data 105 containing display data (e.g., image data and/or video data) of any format, resolution, etc. from an interface 107. The display device 100 may be in communication with the interface 107 using a wired or wireless communication interface. The interface 107 may be any interface including the input data 105. In one example, the interface 107 is a camera that captures the input data 105. In another example, the interface 107 is a game server that generates the input data 105 from video games. In another example, the interface 107 is a content server that generates the input data 105 from media files. In another example, the interface 107 is a memory such as, for example, at least one memory including cache(s), random-access memory(s), hard disk drive(s), flash memory(s), read-only memory(s), compact disk(s), digital versatile disk(s), etc. In another example, the interface 107 is one or more storage devices and/or computing devices (e.g., servers) located at the same or different locations of a network or collection of networks (e.g., in the cloud, in edge devices, etc.). In some examples, the input data 105 loaded to the transceiver device 110 includes groups of similar data such as, for example, similar data regions, rows, columns, etc. In one example, input data 105 includes similar adjacent rows, such as dark sections.

The transceiver device 110 and the memory operator 160 may be implemented by hardware, such as a processor. However, any other type of circuitry may additionally or alternatively be used such as, for example, one or more analog or digital circuit(s), power management integrated circuits (PMIC(s)), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), field programmable logic device(s) (FPLD(s)) (such as field programmable gate arrays (FPGAs)), etc.

The decompression circuit 120, the clocks 130, and the parallel register clock 150 may be implemented by logic circuits. However, any other type of circuitry may additionally or alternatively be used such as, for example, one or more analog or digital circuit(s), PMIC(s), programmable processor(s), programmable controller(s), GPU(s), DSP(s), ASIC(s), PLD(s), FPLD(s) (such as FPGAs), etc.

The display memory 170 may be any memory such as, for example, at least one memory including cache(s), random-access memory(s), hard disk drive(s), flash memory(s), read-only memory(s), compact disk(s), digital versatile disk(s), etc.

The transceiver device 110 receives the input data 105 and compresses the input data 105 or a portion of the input data 105 to form compressed data 175 by implementing one or more compression algorithms. The input data 105 may be a row or a column of data. In some examples, the compression algorithms are lossless compression algorithms that take advantage of similar data included in the input data 105. The similar data may be similar data regions, rows, columns, etc. In one example, the similar data includes similar adjacent rows or columns, such as dark sections. The compressed data 175 may be sent to the decompression circuit 120.

The decompression circuit 120 includes a transmission circuit 180, a compressed data memory 185, and compression override logic circuits 187. The compressed data 175 is transmitted from a transceiver side 190 (e.g., the transceiver device 110) to a receiver side 193 (e.g., compressed data memory 185) of the display device 100 via the transmission circuit 180. Transmitting compressed data 175 may decrease the time and energy needed for transmission compared to transmitting less compressed data (e.g., the input data 105). The compressed data 175 may include compression addressing bits and/or data bits. For example, compression addressing bits include a packet control word (PCW), compression control word (CCW), etc. The PCW indicates the operation (e.g., a row or a column) to be written to in a memory. The CCW indicates compression is being applied. The data bits may be the data from the row or column of the input data 105.

Figure 3:
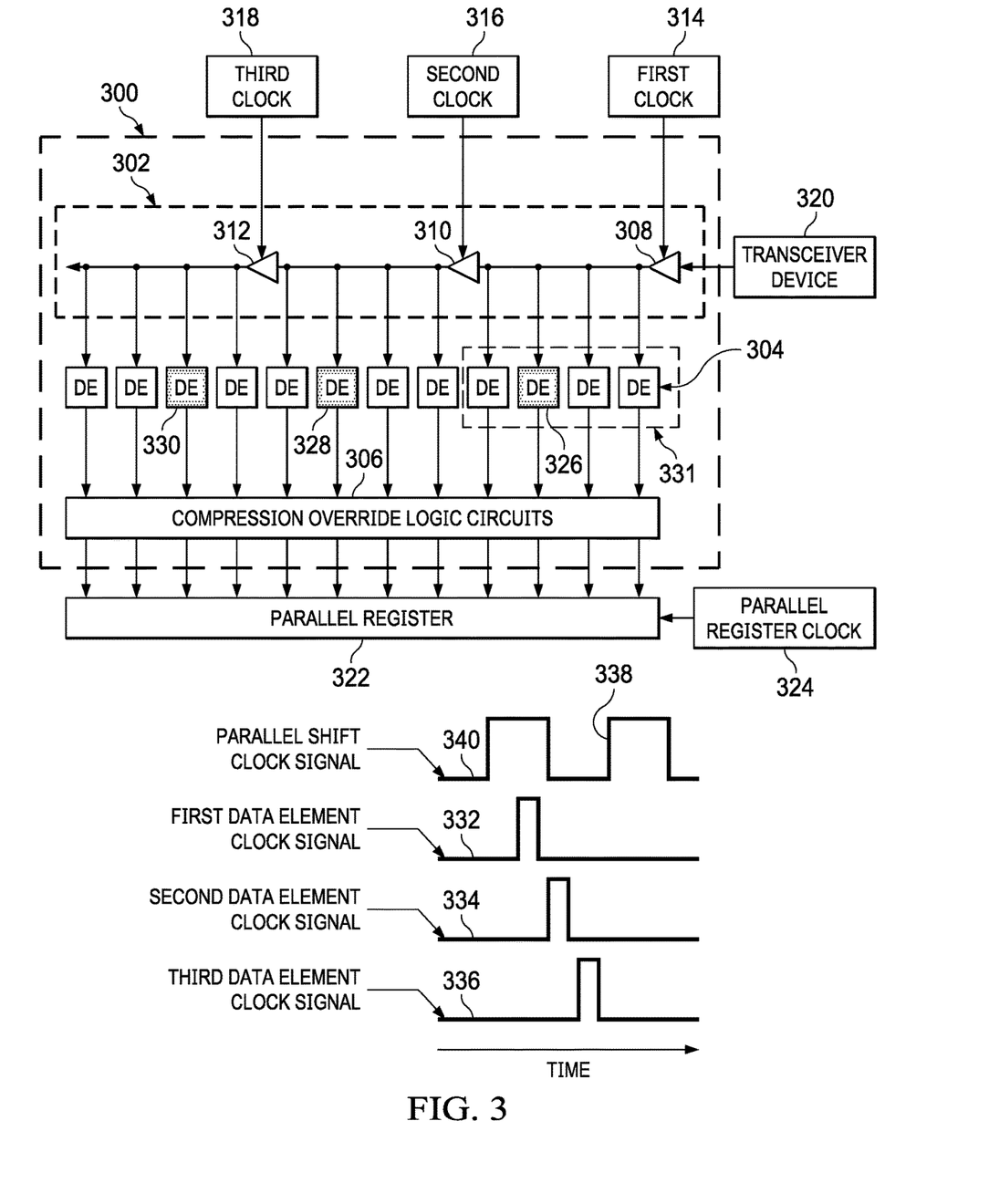
FIG. 3 is an illustration of an example matched buffer decompression circuit and associated clock signals.

The compression override logic circuits 187 decompress the compressed data 175 from the compressed data memory 185 to form decompressed data 195. The decompressed data 195 is stored in the parallel register 140. The transmission circuit 180 may be controlled by the clocks 130. For example, as shown in FIG. 3, the clocks 130 produce clock signals indicating to elements of the transmission circuit 180 to transfer portions of the compressed data 175. The transmission circuit 180 stores the compressed data 175 in the compressed data memory 185. In some examples, the physical distance between the transceiver side 190 and the receiver side 193 is a large physical distance (e.g., 10 millimeters to 20 millimeters) relative to sizes of display device circuits. For example, the display device circuits are decompression circuits implemented in DMDs, liquid crystal displays, magneto-optic spatial light modulators, a LcOS displays, microLED displays, PLMs, etc. The transmission circuit 180 transmitting the compressed data 175 to the compressed data memory 185 may delay the rate at which subsequent compressed data 175 can be sent by the transceiver device 110 because the transmission circuit 180 is not ready to receive data. For example, in cases where the transmission circuit 180 cannot transfer the compressed data 175 to the compressed data memory 185 as fast as the transceiver device 110 is able to send compressed data 175 to the transmission circuit 180, the process of transmitting data to the parallel register 140 slows down.

Decompression overhead is the amount of extra data added to the compressed data 175 to facilitate decompression of the compressed data 175. For example, the parallel register 140 obtains a data stream including data bits from the compressed data memory 185 and the extra data. The extra data may include stall bits (e.g., idle bits) indicating stalls for clock cycles associated with the parallel register clock 150. Further, a stall bit causes no meaningful data to be transferred from the compressed data memory 185 to the parallel register 140 via the compression override logic circuits 187 for a clock cycle duration.

The parallel register 140 may be controlled by the parallel register clock 150. For example, the parallel register clock 150 produces signals indicating to transfer decompressed data 195 from the decompression circuit 120 to the parallel register 140. The delay of decompressing the compressed data 175 may be caused by a delay of transmitting the compressed data 175 to the compressed data memory 185 via the transmission circuit 180. Increasing the decompression overhead may lead to a decreased data compression ratio, which is the ratio between the uncompressed data size and the compressed data size. For example, a data compression ratio is the number of uncompressed bits sent compared to the number of compressed bits sent for the same data. Thus, as the stall bits increase, the compressed data size increases, leading to a decreased data compression ratio.

The memory operator 160 may perform memory operations to store the decompressed data 195 from the parallel register 140 to the display memory 170. In some examples, these memory operations are completed before new decompressed data is available in the parallel register 140, which leads to the stall bits discussed above. For example, the new decompressed data is being formed by the decompression circuit 120 at a time the memory operations are complete. As a result, memory operator 160 stalls because no new decompressed data is available in the parallel register 140 for performing memory operations. As the memory operator 160 is performing memory operations on data loaded to the parallel register 140, new compressed data may be transmitted and loaded to the to the compressed data memory 185.

The display memory 170 may be an array of memory elements to configure the display device 100. The array of memory elements may be embedded on a semiconductor substrate. For example, the memory operator 160 loads data to the array of memory elements to store a configuration of the display device 100. In one example, the display device 100 is a DMD including an array of mirrors. The array of memory elements may store tilt states for each of the mirrors. For example, a tilt state corresponds to a mirror tilted to a degree value relative to the semiconductor substrate (e.g., +10 degrees). The configuration of the array of the mirrors (e.g., tilting of the mirrors) is based on data indicating tilt states loaded to the array of the memory elements. In another example, the display device 100 is a PLM including an array of micromirrors. The array of memory elements may store vertical states for each of the mirrors. For example, a vertical state corresponds to a mirror vertically displaced relative to the semiconductor substrate (e.g., moving towards or away from the semiconductor substrate). The configuration of the array of the mirrors (e.g., vertical displacement of the mirrors) is based on data indicating vertical states loaded to the array of the memory elements.

While an example manner of implementing the display device 100 is illustrated in FIG. 1, one or more of the elements, processes and/or devices illustrated in FIG. 1 may be combined, divided, re-arranged, omitted, eliminated and/or implemented in any other way. Further, the transceiver device 110, the decompression circuit 120, the clocks 130, the parallel register 140, the parallel register clock 150, the memory operator 160, and/or, more generally, the display device 100 may be implemented by hardware, software, firmware and/or any combination of hardware, software and/or firmware. Thus, for example, any of the transceiver device 110, the decompression circuit 120, the clocks 130, the parallel register 140, the parallel register clock 150, the memory operator 160 and/or, more generally, the display device 100 could be implemented by one or more analog or digital circuit(s), PMIC(s), logic circuits, programmable processor(s), programmable controller(s), GPU(s), DSP(s), ASIC(s), PLD(s) and/or FPLD(s). When reading any of the apparatus or system claims of this patent to cover a purely software and/or firmware implementation, at least one of the example, the transceiver device 110, the decompression circuit 120, the clocks 130, the parallel register 140, the parallel register clock 150, the memory operator 160, and/or, more generally, the display device 100 is/are hereby expressly defined to include a non-transitory computer readable storage device or storage disk such as a memory, a digital versatile disk (DVD), a compact disk (CD), a Blu-ray disk, etc. including the software and/or firmware. Further still, the display device 100 of FIG. 1 may include one or more elements, processes and/or devices in addition to, or instead of, those illustrated in FIG. 1, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 2:
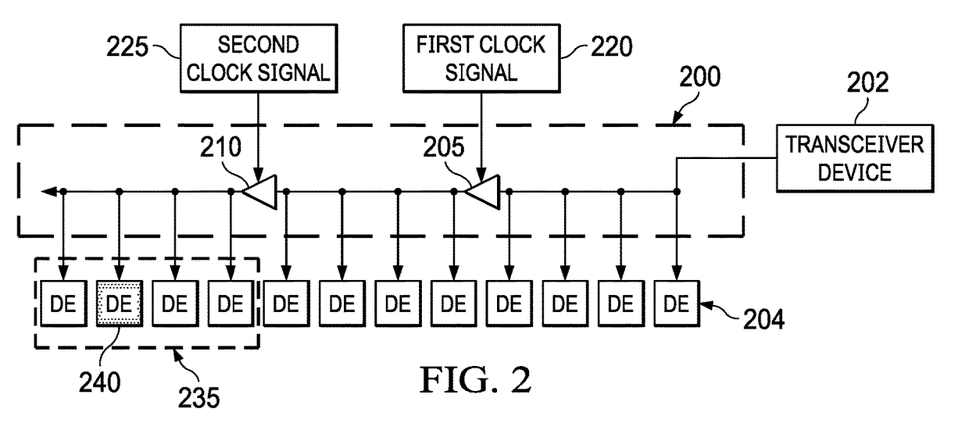
FIG. 2 is an illustration of an example matched buffer transmission circuit.

FIG. 2 is an illustration of an example matched buffer transmission circuit 200. For example, the matched buffer transmission circuit 200 of FIG. 2 is an example of the transmission circuit 180 of FIG. 1 that transfers data over a large physical distance between a transceiver device 202 and data elements 204. The data elements 204 are abbreviated herein as "DE" in FIG. 2. For instance, the transceiver device 202 of FIG. 2 is an example of the transceiver device 110 of FIG. 1, and the data elements 204 are examples of the compressed data memory 185 of FIG. 1. For example, the data elements 204 are portions of a bus. In one example, the data elements 204 are 64-bit data elements.

The matched buffer transmission circuit 200 utilizes buffers to transfer data between the transceiver device 202 and data elements 204. The buffers are controlled by clock signals including clock events (e.g., a rising edge or a falling edge). The clock events cause the buffers to load data to the data elements 204. The buffers are matched in quantity and/or layout based on matching techniques to affect the timing of data being transferred via buffers. For example, the number of buffers included in the matched buffer transmission circuit 200 affects the time it takes for data to travel from the transceiver device 202 to a given buffer because the buffers provide asynchronous delays. The number of buffers may be matched in quantity based on the distance between the transceiver device 202 and the data elements 204. In one example, a buffer needs to be placed every 1 millimeter in between the transceiver device 202 and the data elements 204. Additionally, the location of the buffers included in the matched buffer transmission circuit 200 affects the time it takes for data to travel from the transceiver device 202 to a given buffer because the buffers provide asynchronous delays. The location of buffers may be matched in layout based on the physical placement of the buffers and the routing of wires in between the buffers.

The buffers may be matched in quantity (e.g., a number of buffers on the display device) and layout (e.g., locations and routing of buffers on the display device) based on a timing margin. The timing margin is the time difference between data and a clock event arriving at a buffer for the matched buffer transmission circuit 200 to function correctly. The clock event may cause the buffer to load data to one of the data elements 204. In cases where the matched buffer transmission circuit 200 does not function correctly, the incorrect data may be loaded to the data element. As described above, the buffers are matched in quantity and/or layout to affect the timing of data arriving at buffers. Additionally, clock signals including the clock events (e.g., the clock events causing buffers to load data to data elements 204) are matched to not cause delays loading data to the data elements. The buffers and clock signals are matched to maintain relationships between the timing of data and clock events arriving at buffers. For example, data arrives at a buffer at a first time, and a clock event to a data element arrives at a second time. The time between the first time and the second time is matched based on the timing margin. The first time is based on the quantity and/or layout of the buffers. The second time is based on the clock signal. The time difference between the first time and the second time being than the timing margin may lead to setup time violations. A setup time violation may cause incorrect data to be written and/or loaded to the data element. Additionally, the buffers may be matched based on avoiding skew between data bits to be transferred from the buffers to the data elements. For example, the buffers are matched in quantity and/or layout to introduce little to no skew between data bits loaded in a data element.

In one example, the buffers include buffers 205, 210. Alternatively, more or fewer buffers than the two buffers 205, 210 may be included. The timing of data bits delivered to data elements 204 is matched by matching clock signals 220, 225 associated with the buffers 205, 210. In one example, the clock signals 220, 225 are produced by the clocks 130 of FIG. 1. The first buffer 205 is controlled by the first clock signal 220. The second buffer 210 is controlled by the second clock signal 225. The buffers 205, 210 and clock signals 220, 225 are matched to maintain relationships between the timing of data and clock events arriving at buffers, as described above. For example, first data arrives at the first buffer 205 at a first time. Further, a first clock event associated with the first clock signal 220 may occur at a second time, which causes the first buffer 205 to load first data to a first data element from the data elements 204. The time difference between the first time and the second time may be matched to the timing margin. In one example, the timing margin is 1 nanosecond. As described above, the time difference may be matched by matching the first clock signal 220 and matching the buffers 205, 210 in quantity and/or layout.

In some examples, the buffers 205, 210 transmitting data bits to data elements 204 are delayed relative to the clock signals 220, 225 driving the buffers 205, 210. For example, data bits of a data element from the data elements 204 take more than one clock cycle associated with a clock signal to be delivered to the data element. However, a clock event corresponding to the completion of the clock cycle occurring before the data bits are ready to be written and/or loaded to a data element may cause a setup time violation. The clock cycle (e.g., frequency of the clock signal) may be reduced to introduce a skew on the clock signal, which buffers the clock signal with the data bits. As a result, the data bits are delivered to the data element in one clock cycle, and the clock signals are matched. If the time for data bits to be delivered to a data element (e.g., variable delays) increases, the frequency of the clock cycle is reduced.

In one example, a first data element is routed a physical distance closer to the transceiver device 202 than a second data element. As a result, the first clock signal 220 associated with the first data element may produce a clock event sooner than a second clock signal 225 associated with the second data element due to data taking a longer time to reach the first data element compared to the second data element. Essentially, timing skew is being introduced to the clock signals 220, 225 to match the timing skew of the data being transferred. The timing skew may be the difference between data and clock events being delivered to components. The timing skew is introduced to avoid decreasing the timing margin for a given buffer. In this example, the timing margin is the time difference between the data and a clock event arriving at the given buffer. If the timing is the same for both the first clock signal and the second clock signal, the timing margin is greater for the first data element compared to the second data element. Further, if the clock event occurs before the data is ready to be written and/or loaded to a data element, this may cause a setup time violation causing incorrect data to be written and/or loaded to the data element.

In one example, the transceiver device 202 initiates a transfer of compressed data via one or more of the buffers 205, 210 in response to a first clock event of the second clock signal 225 (e.g., beginning of a first clock cycle). The compressed data is loaded to four data elements 235 associated with the second buffer 210 during the first clock cycle. As a result, the compressed data may be written to four data elements 235 before a second clock event of the second clock signal 225 (e.g., completion of the first clock cycle). In some examples, the compressed data includes a CCW addressing bit indicating only one data element needs to be explicitly written to and the other data elements may be specified as compressed (e.g., all 0's, all 1's). Therefore, one of the four data elements 235 includes explicit data. As shown in FIG. 2, a data element 240 includes explicit data and other three data elements of the four data elements 235 are specified as compressed.

FIG. 3 is an illustration of an example matched buffer decompression circuit 300. For example, the matched buffer decompression circuit 300 is an example of the decompression circuit 120 of FIG. 1. The matched buffer decompression circuit 300 includes a matched buffer transmission circuit 302, data elements 304, and compression override logic circuits 306. The matched buffer transmission circuit 302 is an example of the transmission circuit 180 of FIG. 1 and/or the matched buffer transmission circuit 200 of FIG. 2. The data elements 304 are examples of the compressed data memory 185 of FIG. 1 and/or the data elements 204 of FIG. 2. The compression override logic circuits 306 is an example of the compression override logic circuits 187 of FIG. 1. The buffers and clock signals are matched to maintain relationships between the timing of data and clock events arriving at buffers, such as a timing margin. The matched buffer transmission circuit 302 includes buffers 308, 310, 312 and clocks 314, 316, 318 for transferring data from a transceiver device 320 to the data elements 304. The transceiver device 320 is an example of the transceiver device 110 of FIG. 1 and/or the transceiver device 202 of FIG. 2.

The clocks 314, 316, 318 are coupled to the buffers 308, 310, 312. Further, the buffers 308, 310, 312 are coupled to the data elements 304. The clocks 314, 316, 318 produce clock signals to drive the buffers 308, 310, 312 to load data from the transceiver device 320 to the data elements 304. The data elements 304 are coupled to compression override logic circuits 306. Further, a parallel register 322 may be coupled to the compression override logic circuits 306. The parallel register 322 may be coupled to a parallel register clock 324 which drives the parallel register 322. In some examples, the clocks 314, 316, 318 are implemented by the clocks 130 of FIG. 1. The buffers 308, 310, 312 are examples of the buffers 205, 210 of FIG. 2. The data elements 304 are examples of the data elements 204 of FIG. 2. The parallel register 322 is an example of the parallel register 140 of FIG. 1. Further, the parallel register clock 324 is an example of the parallel register clock 150 of FIG. 1.

The data elements 304 may include data elements 326, 328, 330 loaded with explicit data, whereas the other data elements may be loaded with data that is specified as compressed (e.g., all 0s, all 1s). For example, four data elements 331 from the data elements 304 include compressed data written by the first buffer 308. The four data elements 331 may include a data element 326 with explicit data and the other three data elements with compressed bits (e.g., all 0s, all 1s).

The compression override logic circuits 306 may be configured by the CCW addressing bit included in the compressed data, as described in connection with the compressed data memory 185 of FIG. 1. Therefore, the compression override logic circuits 306 identifies the data elements 304 that include compressed bits (e.g., all 0s, all 1s). As a result, the compression override logic circuits 306 may decompress the data elements 304 by modifying the compressed bits to the explicit data written to the data elements 304. For example, the three data elements with compressed bits (e.g., all 0's, all 1's) from the four data elements 331 are modified to explicit data in the data element 326. The compression override logic circuits 306 may store the decompressed data to the parallel register 322.

For example, a first data element clock signal 332 is produced by the first clock 314 to instruct the first buffer 308 to load data to a first set of the data elements 304 (e.g., write explicit data to the first data element 326); a second data element clock signal 334 is produced by the second clock 316 to instruct the second buffer 310 to load data to a second set of the data elements 304 (e.g., write explicit data to a second data element 328); and a third data element clock signal 336 is produced by the third clock 318 to instruct the third buffer 312 to load data to a third set of the data elements 304 (e.g., write explicit data to the third data element 330). In one example, a clock event (e.g., a rising edge) of the first data element clock signal 332 causes the first buffer 308 to explicitly write first compressed data to the first data element 326. Further, a clock event (e.g., a rising edge) of the second data element clock signal 334 causes the second buffer 310 to explicitly write second compressed data to the second data element 328. Further, a clock event (e.g., a rising edge) of the third data element clock signal 336 causes the third buffer 312 to explicitly write third compressed data to the third data element 330. The clock events of the first data element clock signal 332, the second data element clock signal 334, and the third data element clock signal 336 can be mismatched timing, so long as the data has been loaded to the data elements 304 before the initiation of a parallel shift by a parallel shift clock event 338 (e.g., a rising edge) of the parallel shift clock signal 340.

The parallel shift clock signal 340 indicates clock cycles. In response to the parallel register 322 receiving a parallel shift clock event 338 (e.g., a rising edge), the parallel register 322 parallel shifts the data from the data elements 304 to the parallel register 322 via the compression override logic circuits 306. The parallel shift occurs after all of the data for a given data row or column is loaded in the data elements 304. Thus, the data elements 304 are loaded in a single internal clock cycle (e.g., a clock cycle of the parallel shift clock signal 340) to the parallel register 322 regardless of the location of data elements 304 in a data stream. This parallel shift removes asynchronous delay across loading the data elements 304. Loading all data from the transceiver device 320 in a single cycle eliminates stalls due to pipelines for compressed data, such as in register-based implementations.

The absence of a register-based implementation reduces the complexity of the matched buffer decompression circuit 300, transceiver device 320, etc. For example, the reduced complexity increases the bandwidth of a compression algorithm (e.g., compression algorithm to compress data), which reduces the overall energy usage of the display device 100. Additionally, the reduced complexity leads to less expensive verification and/or reduced area of the matched buffer decompression circuit 300 and/or the transceiver device 320. As a result, the risk of bugs stopping the compression algorithms is reduced. Additionally, the absence of a register-based implementation eliminates the synchronous delay (e.g., stalls) between pipeline stages (e.g., shift registers), which increases the data compression ratio.

Figure 4:
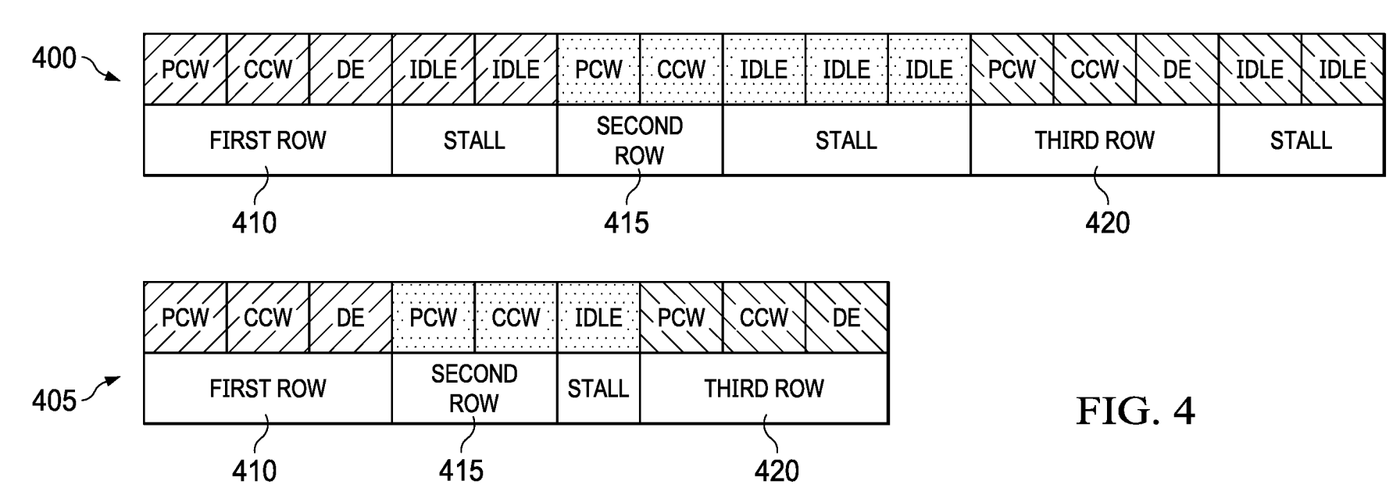
FIG. 4 is an illustration of example data transmitted via a transmission circuit from a transceiver device to a compressed data memory.

FIG. 4 is an illustration of example data transmitted via transmission circuits from a transceiver device to a compressed data memory. The first illustration 400 corresponds to the example data transmitted via shift registers from a transceiver device to a compressed data memory. For example, the shift registers are synchronous registers, causing a synchronous delay (e.g., stalls) between each shift register. The second illustration 405 corresponds to the example data transmitted via buffers from a transceiver device to a compressed data memory. For example, the buffers implement the transmission circuit 180 of FIG. 1, the matched buffer transmission circuit 200, of FIG. 2, and/or the matched buffer transmission circuit 302 of FIG. 3. The example data corresponds to data bits in FIG. 4. As shown in FIG. 4, the total bits to transfer data of a first row 410, a second row 415, and third row 420 are more bits in the first illustration 400 compared to the second illustration 405. As previously described, the shift register transmission circuit causes pipeline stalls which causes significant decompression overhead and poor data compression ratios. The decompression overhead may be the amount of extra data to be added to the compressed data for decompressing the compressed data. For example, the extra data may include adding stall bits (e.g., idle bits) provided to the data stream for the parallel register 140 of FIG. 1, among data bits and compression addressing bits. The data bits and compression addressing bits include PCW bits, CCW bits, and data element (abbreviated herein as "DE" in FIG. 4) bits. As shown in FIG. 4, more idle bits are included in the first illustration 400 compared to second illustration 405.

Figure 5:
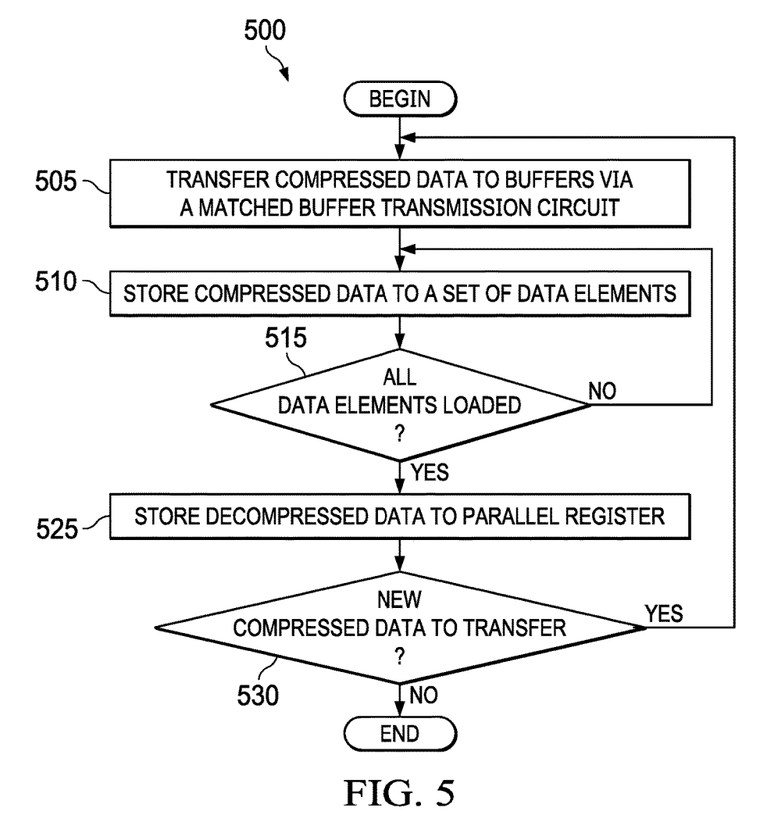
FIG. 5 is flowchart representative of an example process.

FIG. 5 is a flowchart representative of an example process 500 that may be performed using configured hardware and/or machine-readable instructions that may be executed by a processor to implement the display device 100 including a transmission circuit implemented by the transmission circuit of FIG. 1, the matched buffer transmission circuit 200 of FIG. 2, and/or the matched buffer transmission circuit 302 of FIG. 3.

The example process 500 of FIG. 5 begins at block 505, at which a transceiver device 320 transfers compressed data to buffers 308, 310, 312 via a matched buffer transmission circuit 302. Alternatively, the transceiver device 320 may implement the transceiver device 110 of FIG. 1 and/or the transceiver device 202 of FIG. 2; the buffers 308, 310, 312 may implement the buffers 210, 210 of FIG. 2; and the matched buffer transmission circuit 302 may implement the transmission circuit 180 of FIG. 1 and/or the matched buffer transmission circuit 200 of FIG. 2. The compressed data is described in connection with the compressed data 175 of FIG. 1.

At block 510, a buffer stores compressed data to a set of data elements 304. Alternatively, the data elements 304 may implement the data elements 204 of FIG. 2. The buffer may be the buffers 308, 310, 312 of FIG. 3 and/or the buffers 205, 210 of FIG. 2. In one example, the set of the data elements 304 may be loaded in response to a buffer from the buffers 308, 310, 312 receiving a clock event from one of the data element clock signals 332, 334, 336 corresponding to the set of the data elements 304.

At block 515, the parallel register 322 determines whether all data elements 304 have been loaded. Alternatively, the parallel register 322 implements the parallel register 140 of FIG. 1; and the data elements 304 implements the data elements 204 of FIG. 2. In one example, the parallel register 322 determines whether all data elements 304 have been loaded in response to receiving clock events from a parallel shift clock signal 340. For example, the parallel register 322 determines whether a row and/or column of compressed data is loaded to the data elements 304. If the parallel register 322 determines all data elements 304 have not been loaded (e.g., block 515 returns a result of "NO"), the parallel register 322 returns to block 510. If the parallel register 322 determines all data elements 304 have been loaded (e.g., block 515 returns a result of "YES"), the parallel register 322 continues to block 520.

At block 525, the parallel register 322 stores decompressed data to the parallel register 322. Alternatively, the parallel register 322 may implement the parallel register 140 of FIG. 1. For example, the decompressed data includes explicit data from the data elements 304 and compressed bits modified by the compression override logic circuits 306. At block 530, the matched buffer transmission circuit 302 determines whether new compressed data is to be transferred to the data elements 304. Alternatively, the matched buffer transmission circuit 302 implements the transmission circuit 180 of FIG. 1 and/or the matched buffer transmission circuit 200 of FIG. 2; and the data elements 304 implements the data elements 204 of FIG. 2. For example, the decompressed data stored to the parallel register 322 is associated with a first row of the input data 105 of FIG. 1. If the matched buffer decompression circuit 300 determines new compressed data is to be transferred to the data elements 304 (e.g., block 530 returns a result of "YES"), the matched buffer transmission circuit 302 returns to block 505. For example, the new compressed data is a second row of input data 105. As a result, the new compressed data may be transferred to the data elements 304 while a memory operator 160 of FIG. 1 is performing memory operations in the parallel register 140. If the matched buffer transmission circuit 302 determines new compressed data is not to be transferred to the data elements 304 (e.g., block 530 returns a result of "NO"), the example process 500 of FIG. 5 terminates.

Figure 6:
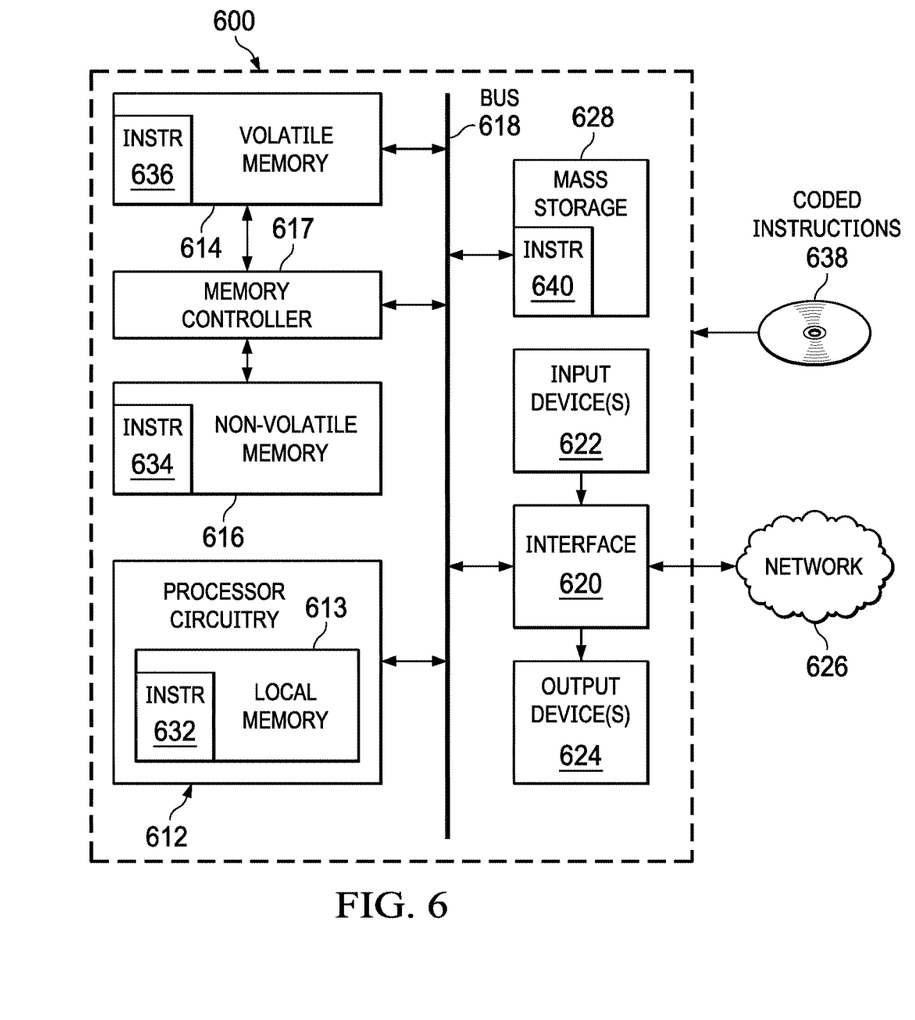
FIG. 6 is a block diagram of an example processing platform including processor circuitry structured to execute the example machine readable instructions of FIG. 5 to implement the display device of FIG. 1.

FIG. 6 is a block diagram of an example processor platform 600 structured to execute and/or instantiate the machine readable instructions and/or operations of FIG. 5 to implement the display device of FIG. 1. The processor platform 600 can be, for example, a server, a personal computer, a workstation, a self-learning machine (e.g., a neural network), a mobile device (e.g., a cell phone, a smart phone, a tablet), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 600 of the illustrated example includes processor circuitry 612. The processor circuitry 612 of the illustrated example is hardware. For example, the processor circuitry 612 can be implemented by one or more integrated circuits, logic circuits, FPGAs microprocessors, central processing units (CPUs), GPUs, DSPs, and/or microcontrollers from any desired family or manufacturer. The processor circuitry 612 may be implemented by one or more semiconductor based (e.g., silicon based) devices. In this example, the processor circuitry 612 implements the transceiver device 110, the clocks 130, the parallel register 140, the parallel register clock 150, the memory operator 160 the transmission circuit 180, and the compression override logic circuits 187.

The processor circuitry 612 of the illustrated example includes a local memory 613 (e.g., a cache, registers, etc.). The processor circuitry 612 of the illustrated example is in communication with a main memory including a volatile memory 614 and a non-volatile memory 616 by a bus 618. The volatile memory 614 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 616 may be implemented by flash memory and/or any other desired type of memory device. Access to the main memory 614, 616 of the illustrated example is controlled by a memory controller 617.

The processor platform 600 of the illustrated example also includes interface circuitry 620. The interface circuitry 620 may be implemented by hardware in accordance with any type of interface standard, such as an Ethernet interface, a universal serial bus (USB) interface, a Bluetooth® interface, a near field communication (NFC) interface, a peripheral component interconnect (PCI) interface, and/or a PCIe interface.

In the illustrated example, one or more input devices 622 are connected to the interface circuitry 620. The input device(s) 622 enable(s) a user to enter data and/or commands into the processor circuitry 612. The input device(s) 622 can be implemented by, for example, an audio sensor, a microphone, a camera (still or video), a keyboard, a button, a mouse, a touchscreen, a track-pad, a trackball, an isopoint device, and/or a voice recognition system.

One or more output devices 624 are also connected to the interface circuitry 620 of the illustrated example. The output devices 624 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 620 of the illustrated example, thus, typically includes a graphics driver card, a graphics driver chip, and/or graphics processor circuitry such as a GPU.

The interface circuitry 620 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 626. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 600 of the illustrated example also includes one or more mass storage devices 628 to store software and/or data. Examples of such mass storage devices 628 include magnetic storage devices, optical storage devices, floppy disk drives, HDDs, CDs, Blu-ray disk drives, redundant array of independent disks (RAID) systems, solid state storage devices such as flash memory devices, and DVD drives.

The machine readable instructions 632, 634, 636, 638, 640 may be implemented by the machine readable instructions of FIG. 5 may be stored in the mass storage device 628, in the volatile memory 614, in the non-volatile memory 616, and/or on a removable non-transitory computer readable storage medium such as a CD or DVD.

Figure 7:
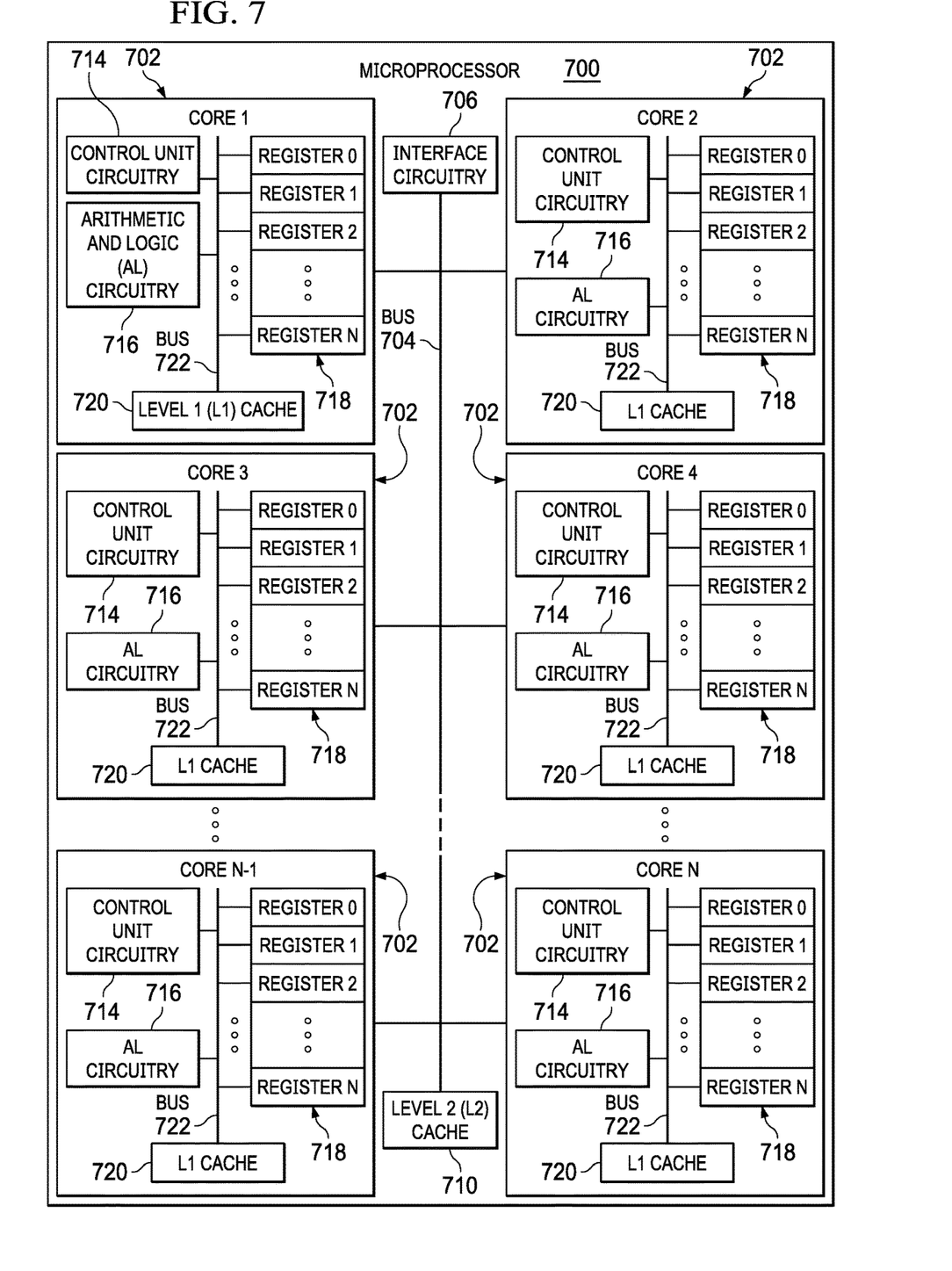
FIG. 7 is a block diagram of an example implementation of the processor circuitry of FIG. 6.

FIG. 7 is a block diagram of an example implementation of the processor circuitry 612 of FIG. 6. In this example, the processor circuitry 612 of FIG. 6 is implemented by a microprocessor 700. For example, the microprocessor 700 may implement multi-core hardware circuitry such as a CPU, a DSP, a GPU, an XPU (any type of processing unit), etc. Although it may include any number of example cores 702 (e.g., 1 core), the microprocessor 700 of this example is a multi-core semiconductor device including N cores. The cores 702 of the microprocessor 700 may operate independently or may cooperate to execute machine readable instructions. For example, machine code corresponding to a firmware program, an embedded software program, or a software program may be executed by one of the cores 702 or may be executed by multiple ones of the cores 702 at the same or different times. In some examples, the machine code corresponding to the firmware program, the embedded software program, or the software program is split into threads and executed in parallel by two or more of the cores 702. The software program may correspond to a portion or all of the machine readable instructions and/or operations represented by the flowchart of FIG. 5.

The cores 702 may communicate by an example bus 704. In some examples, the bus 704 may implement a communication bus to effectuate communication associated with one(s) of the cores 702. For example, the bus 704 may implement at least one of an Inter-Integrated Circuit (I2C) bus, a Serial Peripheral Interface (SPI) bus, a PCI bus, or a PCIe bus. Additionally or alternatively, the bus 704 may implement any other type of computing or electrical bus. The cores 702 may obtain data, instructions, and/or signals from one or more external devices by example interface circuitry 706. The cores 702 may output data, instructions, and/or signals to the one or more external devices by the interface circuitry 706. Although the cores 702 of this example include example local memory 720 (e.g., Level 1 (L1) cache that may be split into an L1 data cache and an L1 instruction cache), the microprocessor 700 also includes example shared memory 710 that may be shared by the cores (e.g., Level 2 (L2) cache)) for high-speed access to data and/or instructions. Data and/or instructions may be transferred (e.g., shared) by writing to and/or reading from the shared memory 710. The local memory 720 of each of the cores 702 and the shared memory 710 may be part of a hierarchy of storage devices including multiple levels of cache memory and the main memory (e.g., the main memory 614, 616 of FIG. 6). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 702 may be referred to as a CPU, DSP, GPU, etc., or any other type of hardware circuitry. Each core 702 includes control unit circuitry 714, arithmetic and logic (AL) circuitry (sometimes referred to as an ALU) 716, a plurality of registers 718, the L1 cache 720, and an example bus 722. Other structures may be present. For example, each core 702 may include vector unit circuitry, single instruction multiple data (SIMD) unit circuitry, load/store unit (LSU) circuitry, branch/jump unit circuitry, floating-point unit (FPU) circuitry, etc. The control unit circuitry 714 includes semiconductor-based circuits structured to control (e.g., coordinate) data movement within the corresponding core 702. The AL circuitry 716 includes semiconductor-based circuits structured to perform one or more mathematic and/or logic operations on the data within the corresponding core 702. The AL circuitry 716 of some examples performs integer based operations. In other examples, the AL circuitry 716 also performs floating point operations. In yet other examples, the AL circuitry 716 may include first AL circuitry that performs integer based operations and second AL circuitry that performs floating point operations. In some examples, the AL circuitry 716 may be referred to as an Arithmetic Logic Unit (ALU). The registers 718 are semiconductor-based structures to store data and/or instructions such as results of one or more of the operations performed by the AL circuitry 716 of the corresponding core 702. For example, the registers 718 may include vector register(s), SIMD register(s), general purpose register(s), flag register(s), segment register(s), machine specific register(s), instruction pointer register(s), control register(s), debug register(s), memory management register(s), machine check register(s), etc. The registers 718 may be arranged in a bank as shown in FIG. 7. Alternatively, the registers 718 may be organized in any other arrangement, format, or structure including distributed throughout the core 702 to shorten access time. The bus 704 may implement at least one of an I2C bus, a SPI bus, a PCI bus, or a PCIe bus.

Each core 702 and/or, more generally, the microprocessor 700 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 700 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 8:
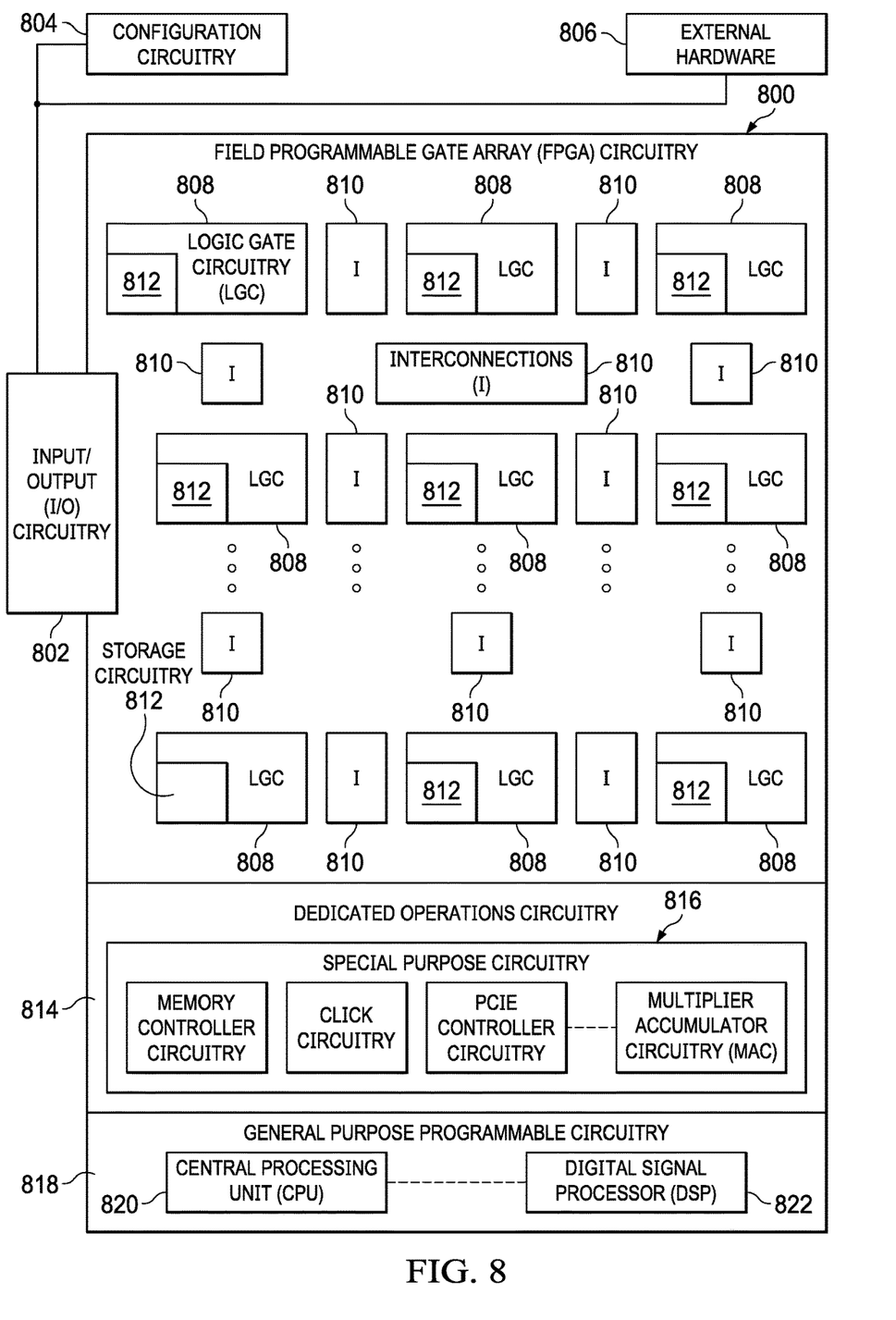
FIG. 8 is a block diagram of another example implementation of the processor circuitry of FIG. 6.

FIG. 8 is a block diagram of another example implementation of the processor circuitry 612 of FIG. 6. In this example, the processor circuitry 612 is implemented by FPGA circuitry 800. The FPGA circuitry 800 can be used, for example, to perform operations that could otherwise be performed by the example microprocessor 700 of FIG. 7 executing corresponding machine readable instructions. However, once configured, the FPGA circuitry 800 instantiates the machine readable instructions in hardware and, thus, can often execute the operations faster than they could be performed by a general purpose microprocessor executing the corresponding software.

More specifically, in contrast to the microprocessor 700 of FIG. 7 described above (which is a general purpose device that may be programmed to execute some or all of the machine readable instructions represented by the flowchart of FIG. 5 but whose interconnections and logic circuitry are fixed once fabricated), the FPGA circuitry 800 of the example of FIG. 8 includes interconnections and logic circuitry that may be configured and/or interconnected in different ways after fabrication to instantiate, for example, some or all of the machine readable instructions represented by the flowchart of FIG. 5. In particular, the FPGA circuitry 800 may be thought of as an array of logic gates, interconnections, and switches. The switches can be programmed to change how the logic gates are interconnected by the interconnections, effectively forming one or more dedicated logic circuits (unless and until the FPGA circuitry 800 is reprogrammed). The configured logic circuits enable the logic gates to cooperate in different ways to perform different operations on data received by input circuitry. Those operations may correspond to some or all of the software represented by the flowchart of FIG. 5. As such, the FPGA circuitry 800 may be structured to effectively instantiate some or all of the machine readable instructions of the flowchart of FIG. 5 as dedicated logic circuits to perform the operations corresponding to those software instructions in a dedicated manner analogous to an ASIC. Therefore, the FPGA circuitry 800 may perform the operations corresponding to the some or all of the machine readable instructions of FIG. 5 faster than the general purpose microprocessor can execute the same.

In the example of FIG. 8, the FPGA circuitry 800 is structured to be programmed (and/or reprogrammed one or more times) by an end user by a hardware description language (HDL) such as Verilog. The FPGA circuitry 800 of FIG. 8, includes example input/output (I/O) circuitry 802 to obtain and/or output data to/from example configuration circuitry 804 and/or external hardware (e.g., external hardware circuitry) 806. For example, the configuration circuitry 804 may implement interface circuitry that may obtain machine readable instructions to configure the FPGA circuitry 800, or portion(s) thereof. In some such examples, the configuration circuitry 804 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 806 may implement the microprocessor 700 of FIG. 7. The FPGA circuitry 800 also includes an array of example logic gate circuitry 808, a plurality of example configurable interconnections 810, and example storage circuitry 812. The logic gate circuitry 808 and interconnections 810 are configurable to instantiate one or more operations that may correspond to at least some of the machine readable instructions of FIG. 5 and/or other desired operations. The logic gate circuitry 808 shown in FIG. 8 is fabricated in groups or blocks. Each block includes semiconductor-based electrical structures that may be configured into logic circuits. In some examples, the electrical structures include logic gates (e.g., AND gates, OR gates, NOR gates, etc.) that provide basic building blocks for logic circuits. Electrically controllable switches (e.g., transistors) are present within each of the logic gate circuitry 808 to enable configuration of the electrical structures and/or the logic gates to form circuits to perform desired operations. The logic gate circuitry 808 may include other electrical structures such as look-up tables (LUTs), registers (e.g., flip-flops or latches), multiplexers, etc.

The interconnections 810 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 808 to program desired logic circuits.

The storage circuitry 812 of the illustrated example is structured to store result(s) of the one or more of the operations performed by corresponding logic gates. The storage circuitry 812 may be implemented by registers or the like. In the illustrated example, the storage circuitry 812 is distributed amongst the logic gate circuitry 808 to facilitate access and increase execution speed.

The example FPGA circuitry 800 of FIG. 8 also includes example dedicated operations circuitry 814. In this example, the dedicated operations circuitry 814 includes special purpose circuitry 816 that may be invoked to implement commonly used functions to avoid the need to program those functions in the field. Examples of such special purpose circuitry 816 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 800 may also include example general purpose programmable circuitry 818 such as an example CPU 820 and/or an example DSP 822. Other general purpose programmable circuitry 818 may additionally or alternatively be present such as a GPU, an XPU, etc., that can be programmed to perform other operations.

Although FIGS. 7 and 8 illustrate two example implementations of the processor circuitry 612 of FIG. 6, many other approaches are contemplated. For example, as mentioned above, modern FPGA circuitry may include an on-board CPU, such as one or more of the example CPU 820 of FIG. 8. Therefore, the processor circuitry 612 of FIG. 6 may additionally be implemented by combining the example microprocessor 700 of FIG. 7 and the example FPGA circuitry 800 of FIG. 8. In some such hybrid examples, a first portion of the machine readable instructions represented by the flowchart of FIG. 5 may be executed by one or more of the cores 702 of FIG. 7 and a second portion of the machine readable instructions represented by the flowchart of FIG. 5 may be executed by the FPGA circuitry 800 of FIG. 8.

In some examples, the processor circuitry 612 of FIG. 6 may be in one or more packages. For example, the processor circuitry 612 of FIG. 6 and/or the FPGA circuitry 800 of FIG. 8 may be in one or more packages. In some examples, an XPU may be implemented by the processor circuitry 612 of FIG. 6, which may be in one or more packages. For example, the XPU may include a CPU in one package, a DSP in another package, a GPU in yet another package, and an FPGA in still yet another package.

Figure 9:
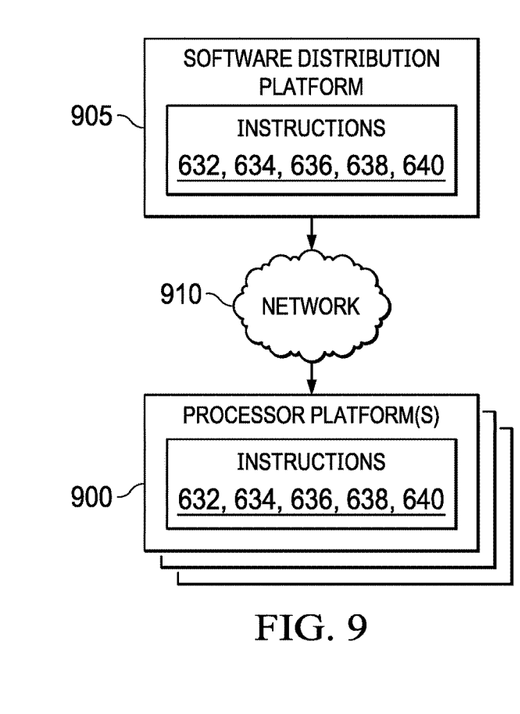
FIG. 9 is a block diagram of an example software distribution platform (e.g., one or more servers) to distribute software (e.g., software corresponding to the example machine readable instructions of FIG. 5) to client devices associated with end users and/or consumers (e.g., for license, sale, and/or use), retailers (e.g., for sale, re-sale, license, and/or sub-license), and/or original equipment manufacturers (OEMs) (e.g., for inclusion in products to be distributed to, for example, retailers and/or to other end users such as direct buy customers).

A block diagram illustrating an example software distribution platform 905 to distribute software such as the example machine readable instructions 632, 634, 636, 638, 640 of FIG. 6 to hardware devices owned and/or operated by third parties is illustrated in FIG. 9. The example software distribution platform 905 may be implemented by any computer server, data facility, cloud service, etc., capable of storing and transmitting software to other computing devices. The third parties may be customers of the entity owning and/or operating the software distribution platform 905. For example, the entity that owns and/or operates the software distribution platform 905 may be a developer, a seller, and/or a licensor of software such as the example machine readable instructions 632, 634, 636, 638, 640 of FIG. 6. The third parties may be consumers, users, retailers, OEMs, etc., who purchase and/or license the software for use and/or re-sale and/or sub-licensing. In the illustrated example, the software distribution platform 905 includes one or more servers and one or more storage devices. The storage devices store the machine readable instructions 632, 634, 636, 638, 640, which may correspond to the example process 500 of FIG. 5, as described above. The one or more servers of the example software distribution platform 905 are in communication with a network 910, which may correspond to any one or more of the Internet and/or any of the example networks 910 described above. In some examples, the one or more servers are responsive to requests to transmit the software to a requesting party as part of a commercial transaction. Payment for the delivery, sale, and/or license of the software may be handled by the one or more servers of the software distribution platform and/or by a third party payment entity. The servers enable purchasers and/or licensors to download the machine readable instructions 632, 634, 636, 638, 640 from the software distribution platform 905. For example, the software, which may correspond to the example process 500 of FIG. 5, may be downloaded to the example processor platform 900, which is to execute the machine readable instructions 632, 634, 636, 638, 640 to implement the display device 100 of FIG. 1. In some example, one or more servers of the software distribution platform 905 periodically offer, transmit, and/or force updates to the software (e.g., the example machine readable instructions 632, 634, 636, 638, 640 of FIG. 6) to ensure improvements, patches, updates, etc., are distributed and applied to the software at the end user devices.

From the foregoing, it will be appreciated that methods, apparatus and articles of manufacture have been disclosed that implement a decompression circuit including buffers to transfer data (e.g., compressed data) on a display device such as, for example, from a transceiver side to a receiver side of the display device. The buffers are matched utilizing matching techniques. The buffers may be matched in quantity (e.g., determining a number of buffers on the display device) and layout (e.g., determining locations and routing of buffers on the display device) to affect the timing of data arriving at buffers. Further, clock signals including the clock events (e.g., the clock events causing buffers to load data to data elements) are matched to not cause delays loading data to the data elements. The buffers and clock signals are matched to maintain relationships between the timing of data and clock events arriving at buffers, such as a timing margin. The disclosed methods, apparatus and articles of manufacture reduce the overall energy of the display device and the risks of bugs. The disclosed methods, apparatus and articles of manufacture are accordingly directed to one or more improvement(s) in the functioning of a computer.

What is claimed is:

1. A circuit comprising:
   a first data element, wherein the first data element is a first portion of a bus;
   a second data element, wherein the second data element is a second portion of the bus;
   a first buffer having a first buffer input and a first buffer output, the first buffer output coupled to the first data element, the first buffer adapted to be coupled to a first clock;
   a second buffer having a second buffer input and a second buffer output, the second buffer output coupled to the second data element and the second buffer input coupled to the first buffer output, the second buffer adapted to be coupled to a second clock;
   logic circuits coupled to the first data element and to the second data element; and
   a parallel register coupled to the logic circuits.

2. The circuit of claim 1, further comprising a transceiver device coupled to the first buffer input.

3. The circuit of claim 2, wherein the first data element and the second data element are included in a set of data elements.

4. The circuit of claim 1, further comprising:
   a memory operator coupled to the parallel register; and
   a memory coupled to the memory operator.

5. The circuit of claim 1, wherein the first buffer and the second buffer are associated with a quantity, wherein first data arrives at the first buffer at a first time based on the quantity, wherein second data arrives at the second buffer at a second time based on the quantity.

6. The circuit of claim 5, wherein the first buffer is configured to obtain a first clock event from the first clock to cause the first buffer to load the first data to the first data element at a third time, wherein the second buffer is configured to obtain a second clock event from the second clock to cause the second buffer to load the second data to the second data element at a fourth time, wherein a first time difference between the first time and the third time is based on a first timing margin, wherein a second time difference between the second time and the fourth time is based on a second timing margin.

7. The circuit of claim 1, wherein the first buffer and the second buffer are associated with a layout, wherein first data arrives at the first buffer at a first time based on the layout, wherein second data arrives at the second buffer at a second time based on the layout.

8. The circuit of claim 7, wherein the first buffer is configured to obtain a first clock event from the first clock to cause the first buffer to load the first data to the first data element at a third time, wherein the second buffer is configured to obtain a second clock event from the second clock to cause the second buffer to load the second data to the second data element at a fourth time, wherein a first time difference between the first time and the third time is based on a first timing margin, wherein a second time difference between the second time and the fourth time is based on a second timing margin.

9. The circuit of claim 7, wherein the layout comprises a first location and a second location, the first location associated with the first buffer, the second location associated with the second buffer.

10. The circuit of claim 1, wherein the parallel register is configured to obtain a parallel shift clock event to cause data to be loaded to the parallel register from the first data element and the second data element via the logic circuits.

11. The circuit of claim 1, wherein the first data element includes data transferred in a single clock cycle.

12. The circuit of claim 1, wherein the first buffer is configured to load first data in the first data element responsive to receiving a first clock signal at a first time, and the second buffer is configured to load first data in the second data element responsive to receiving a second clock signal from the second clock at a second time, the second time different from the first time.

13. A device comprising:
   a first buffer configured to store a first set of data bits to a first data element in response to receiving a first clock event from a first clock;
   a second buffer coupled to the first buffer, the second buffer configured to store a second set of data bits to a second data element in response to receiving a second clock event from a second clock, the first clock and the second clock matched based on timing of the first buffer and the second buffer;
   logic circuits coupled to the first buffer and to the second buffer; and
   a parallel register coupled to the logic circuits, wherein the logic circuits are configured to decompress the first set of data bits in the first data element and the second set of data bits in the second data element to produce decompressed data and store the decompressed data in the parallel register.

14. The device of claim 13, further comprising a transceiver device coupled to the first buffer, the transceiver device configured to produce the first set of data bits and the second set of data bits by compressing a row or a column of input data.

15. The device of claim 13, wherein the first data element includes compressed bits and the second data element includes uncompressed bits, and wherein the logic circuits are configured to:
 decompress the compressed bits included in the first data element by modifying the first data element to correspond to the second data element.

16. The device of claim 13, wherein a memory operator is configured to store the decompressed data to the parallel register by performing memory operations.

17. The device of claim 13, wherein the logic circuits are configured to, responsive to receiving a parallel clock event, decompress the first set of data elements in the first data element and the second set of data bits in the second data element to produce decompressed data and store the decompressed data in parallel in the parallel register.

18. A display device comprising:
 a transceiver side including a transceiver device;
 a transmission circuit coupled to the transceiver device, the transmission circuit comprising:
  a first buffer; and
  a second buffer coupled to the first buffer; and
 a receiver side including:
  compressed data memory coupled to the transmission circuit, the compressed data memory comprising a first data element and a second data element, wherein the first buffer is configured to store a first set of data bits to the first data element in response to receiving a first clock event from a first clock, and the second buffer is configured to store a second set of data bits to the second data element in response to receiving a second clock event from a second clock;
  logic circuits coupled to the compressed data memory;
  a parallel clock register; and
  a parallel register coupled to the logic circuits and to the parallel clock register, wherein the logic circuits configured to decompress the first set of data bits and the second set of data bits stored in the compressed data memory to produce decompressed data to store the decompressed data in the parallel register.

19. The display device of claim 18, wherein the transmission circuit utilizes the first buffer and the second buffer to transmit compressed data from the transceiver side to the receiver side.

20. The display device of claim 18, wherein the receiver side further comprises a memory operator coupled to the parallel register.

* * * * *